United States Patent
Ko et al.

(10) Patent No.: US 9,530,570 B2
(45) Date of Patent: Dec. 27, 2016

(54) MANUFACTURING METHOD OF SOLID-STATE DYE-SENSITIZED SOLAR CELLS AND ELECTROLYTE FILLING DEVICE USED THEREFOR

(71) Applicant: KOREA INSTITUTE OF SCIENCE AND TECHNOLOGY, Seoul (KR)

(72) Inventors: Min-Jae Ko, Seoul (KR); Doh-Kwon Lee, Seoul (KR); Hong-Gon Kim, Seoul (KR); Jin-Young Kim, Gyeonggi-do (KR); Ki-Cheon Yoo, Seoul (KR); Jin-Ah Lee, Seoul (KR); Bong-Soo Kim, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 122 days.

(21) Appl. No.: 14/141,870

(22) Filed: Dec. 27, 2013

(65) Prior Publication Data

US 2014/0335648 A1 Nov. 13, 2014

(30) Foreign Application Priority Data

May 10, 2013 (KR) .................. 10-2013-0053403

(51) Int. Cl.
*H01G 9/00* (2006.01)
*H01G 9/04* (2006.01)
(Continued)

(52) U.S. Cl.
CPC ............ *H01G 9/2009* (2013.01); *H01G 9/204* (2013.01); *H01G 9/2027* (2013.01);
(Continued)

(58) Field of Classification Search
CPC .. H01G 9/2009; H01G 9/2059; H01G 9/2027; H01G 9/2031; H01G 9/2036; H01G 9/204; H01L 51/0086; Y02E 10/542
(Continued)

(56) References Cited

U.S. PATENT DOCUMENTS 6,291,763 B1 * 9/2001 Nakamura ........... H01G 9/2009
                                                      136/252
6,384,321 B1 * 5/2002 Mikoshiba ........... H01G 9/2004
                                                      136/256
(Continued)

FOREIGN PATENT DOCUMENTS

JP 2005-019132 A 1/2005
KR 1020080038651 A 5/2008
(Continued)

OTHER PUBLICATIONS

U. Bach, et al; "Solid-state dye-sensitized mesoporous TiO$_2$ solar cells with high photon-to-electron conversion efficiencies", Nature, vol. 395, Oct. 8, 1998, pp. 583-585.

*Primary Examiner* — Mary Wilczewski
(74) *Attorney, Agent, or Firm* — Ladas & Parry LLP

(57) ABSTRACT

The present description is directed to a manufacturing method of solid-state dye-sensitized solar cells and a solid-state electrolyte filling device used in the manufacturing method. The present invention provides a manufacturing method of dye-sensitized solar cells that fills the solid-state electrolyte more uniformly with enhanced efficiency to secure higher light-to-energy conversion efficiency.

16 Claims, 4 Drawing Sheets

Form a porous layer including metal oxide particles on a transparent conducting substrate Adsorb photosensitized dye on the porous layer Fill a solid-state electrolyte in the pores of the porous layer by pressure difference under vacuum Form a metal electrode on the porous layer

(51) Int. Cl.
  *H01G 9/20* (2006.01)
  *H01L 51/00* (2006.01)
(52) U.S. Cl.
  CPC ......... *H01G 9/2031* (2013.01); *H01G 9/2036* (2013.01); *H01G 9/2059* (2013.01); *H01L 51/0086* (2013.01); *Y02E 10/542* (2013.01)
(58) Field of Classification Search
  USPC ............... 438/82, 85; 136/252, 256, 263
  See application file for complete search history.

(56) References Cited

U.S. PATENT DOCUMENTS

| | | | | |
|---|---|---|---|---|
| 2003/0013008 A1* | 1/2003 | Ono | ............ | H01G 9/2009 429/111 |
| 2005/0076949 A1* | 4/2005 | Komiya | ............ | H01G 9/2009 136/263 |
| 2006/0021649 A1* | 2/2006 | Kuroda | ............ | H01G 9/2031 136/263 |
| 2006/0057465 A1* | 3/2006 | Ogata | ............ | H01B 1/122 429/309 |
| 2007/0289628 A1* | 12/2007 | Sohn | ............ | H01G 9/2022 136/256 |
| 2008/0057355 A1* | 3/2008 | Ajiki | ............ | H01G 9/2068 429/9 |
| 2008/0138683 A1* | 6/2008 | Yoshikawa | ............ | H01M 4/8605 429/480 |
| 2008/0210297 A1* | 9/2008 | Hayase | ............ | H01G 9/2031 136/252 |
| 2009/0133741 A1* | 5/2009 | Higuchi | ............ | H01G 9/2031 136/252 |
| 2009/0173380 A1* | 7/2009 | Shin | ............ | H01L 51/0072 136/256 |
| 2009/0266417 A1* | 10/2009 | Baker | ............ | H01G 9/2031 136/256 |
| 2009/0293947 A1* | 12/2009 | Higuchi | ............ | H01G 9/2031 136/256 |
| 2010/0117033 A1* | 5/2010 | Guo | ............ | H01G 9/2027 252/507 |
| 2010/0300537 A1* | 12/2010 | Murai | ............ | B82Y 10/00 136/263 |
| 2011/0041915 A1* | 2/2011 | Miyasaka | ............ | H01G 9/2013 136/256 |
| 2014/0335648 A1* | 11/2014 | Ko | ............ | H01G 9/2009 438/82 |
| 2014/0373344 A1* | 12/2014 | Takada | ............ | H01G 9/0029 29/623.5 |

FOREIGN PATENT DOCUMENTS

| | | |
|---|---|---|
| KR | 1020100107348 A | 10/2010 |
| KR | 1020120038829 A | 4/2012 |

\* cited by examiner

Form a porous layer including metal oxide particles on a transparent conducting substrate Adsorb photosensitized dye on the porous layer Fill a solid-state electrolyte in the pores of the porous layer by pressure difference under vacuum Form a metal electrode on the porous layer

MANUFACTURING METHOD OF SOLID-STATE DYE-SENSITIZED SOLAR CELLS AND ELECTROLYTE FILLING DEVICE USED THEREFOR

CROSS-REFERENCE TO RELATED APPLICATION

This application claims priority to and the benefit of Korean Patent Application No. 10-2013-0053403 filed in the Korean Intellectual Property Office on May 10, 2013, the entire contents of which are incorporated herein by reference.

TECHNICAL FIELD

The present invention relates to a manufacturing method of dye-sensitized solar cells including a solid-state electrolyte, and a solid-state electrolyte filling device used therefor.

BACKGROUND

A dye-sensitized solar cell is a photoelectrochemical solar cell originally invented by Grätzel et al. in Switzerland in 1991. Generally, it includes photosensitive dye molecules capable of creating electron-hole pairs, a transition metal oxide used for transport of electrons generated, an electrolyte, and electrodes positioned on both sides.

The dye-sensitized solar cell has advantages over the existing silicon solar cells, such as its simple and eco-friendly manufacturing process and low production cost per electricity generated by it. The conventional dye-sensitized solar cells are, however, prepared using a liquid-state electrolyte and are thus disadvantageously poor in reliability and long-term stability due to leakage or volatilization of the electrolyte.

As one of the solutions to this problem, a dye-sensitized solar cell using a solid-state amorphous and polymer electrolyte as a hole-transporting material has been suggested [Bach, U. et al., Nature 395, 583-585 (1998)].

However, the solid-state electrolyte has such a high viscosity that it cannot be sufficiently filled in gaps formed between semiconductor particles constituting the photoelectrodes in the manufacture of the dye-sensitized solar cell. Such a limited fill efficiency of the electrolyte leads to a difficulty in making the photoelectrodes thick, consequently with deteriorated light-to-energy conversion efficiency and poor reproducibility based on the process environments.

SUMMARY

Therefore, the present invention provides a manufacturing method of dye-sensitized solar cells that enables filling a solid-state electrolyte more uniformly with enhanced efficiency and securing higher light-to-energy conversion efficiency.

The present invention also provides a solid-state electrolyte filling device used for the manufacture of the dye-sensitized solar cells.

In accordance with one embodiment of the present invention, a manufacturing method of dye-sensitized solar cells is provided, which includes: (a) forming a porous layer including metal oxide particles on a substrate 10; (b) adsorbing a photosensitized dye on the porous layer; (c) filling a solid-state electrolyte in pores of the porous layer with the photosensitized dye adsorbed thereon under vacuum conditions by a pressure difference; and (d) forming a metal electrode on the porous layer filled with the solid-state electrolyte.

In this regard, the step (c) of filling the solid-state electrolyte may be performed by gradually increasing pressure to atmospheric pressure under vacuum conditions of 50 to 70 kPa to fill the solid-state electrolyte through diffusion.

The substrate may include: a transparent substrate; a conductive thin film formed on the transparent substrate; and a blocking layer covering the conductive thin film, being adjacent to the porous layer, and containing a metal oxide.

The step (a) of forming the porous layer may be performed by applying a paste including metal oxide particles, a binder, and a solvent onto the substrate 10 and then performing heat treatment at a temperature of 450 to 550° C. for 1 to 2 hours.

The step (b) of adsorbing the photosensitized dye may be performed by immersing the substrate having the porous layer formed thereon in a solution containing a photosensitized dye for 10 minutes to 24 hours.

The step (d) of forming the metal electrode may be performed by sputtering, cathode arc deposition, vapor deposition, electron beam deposition, chemical vapor deposition, atomic layer deposition, electrochemical deposition, spin coating, spray coating, doctor blade coating, or screen printing.

In accordance with another embodiment of the present invention, a solid-state electrolyte filling device for dye-sensitized solar cells is provided, which includes: a stage for placing a substrate including a porous layer with a photosensitized dye adsorbed thereon; a chamber covering the stage to form a closed space; an electrolyte injecting portion provided on the top of the chamber and used to feed a solid-state electrolyte into the closed space through a nozzle; and a low-vacuum pump connected to the chamber.

In this regard, the device may further include a fixing unit formed on the stage and used to fix the substrate on the stage.

The device may further include a heat transfer unit formed on the stage and used to transfer heat to the substrate.

The device may further include a nozzle length-adjusting unit formed on the electrolyte injecting portion and used to adjust the distance between the nozzle and the stage.

According to the present invention, a solid-state electrolyte with high viscosity can be filled more uniformly with enhanced efficiency, overcoming the limitation in the thickness of the photoelectrodes and thus ensuring the manufacture of dye-sensitized solar cells capable of providing higher light-to-energy conversion efficiency.

Figure 1:
FIG. 1 is a schematic flowchart showing a manufacturing method for dye-sensitized solar cells according to one embodiment of the present invention.
Figure 1:
Figure 1:

1: Transparent substrate
3: Conductive thin film
5: Blocking layer
10: Transparent conducting substrate
20: Porous layer
30: Metal electrode
100: Stage
200: Chamber
250: Electrolyte injecting portion
300: Low-vacuum pump
400: Control portion

DETAILED DESCRIPTION OF THE EMBODIMENTS

Hereinafter, a detailed description will be given as to a manufacturing method for solid-state dye-sensitized solar cells and a solid-state electrolyte filling device therefor according to the present invention for the purpose of facilitating an understanding of the present invention to those skilled in the art of the present invention (hereinafter referred to as "the related art"). The examples of the present invention are susceptible to many changes and modifications and should not be construed to limit the scope of the present invention.

The terminology used herein is for describing particular embodiments only and is not intended to be limiting of example embodiments of the invention. As used herein, the singular forms "a", "an", and "the" are intended to include the plural forms as well, unless the context clearly indicates otherwise.

It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof.

In the general manufacturing method for solid-state dye-sensitized solar cells, a solid-state electrolyte filling process (that is, a process of immersing a photoelectrode including a dye-adsorbed porous layer in a solid-state electrolyte solution for a predetermined period of time to have the solid-state electrolyte adsorbed on the porous layer) not only involves the solid-state electrolyte having the difficulty in penetrating into the porous layer due to the characteristics of the solid-state electrolyte but also leads to deterioration of the fill efficiency, such as taking a long time for filling the electrolyte. Such poor fill efficiency of the solid-state electrolyte entails the difficulty of increasing the thickness of the photoelectrode to a predetermined level or above, and hence the limitation in enhancing the light-to-energy conversion efficiency of the solar cells.

Therefore, the inventors of the present invention repeatedly studied solid-state dye-sensitized solar cells and determined that filling the solid-state electrolyte through diffusion into the pores of the porous layer by a pressure difference under low vacuum conditions not only results in the solid-state electrolyte being filled more uniformly with enhanced efficiency in spite of the high viscosity of the solid-state electrolyte, but also overcomes the limitation in the thickness of the photoelectrode, making it possible to manufacture a dye-sensitized solar cell capable of providing higher light-to-energy conversion efficiency, thereby completing the present invention.

According to one embodiment of the present invention, a manufacturing method of dye-sensitized solar cells is provided, which includes: (a) forming a porous layer 20 including metal oxide particles on a substrate 10; (b) adsorbing a photosensitized dye on the porous layer 20; (c) filling a solid-state electrolyte in pores of the porous layer 20 with the photosensitized dye adsorbed thereon under vacuum conditions by a pressure difference; and (d) forming a metal electrode 30 on the porous layer 20 filled with the solid-state electrolyte.

In other words, the present invention provides a method of performing a solid-state electrolyte filling process on the porous layer 20 through diffusion into the pores of the porous layer by the pressure difference under vacuum conditions, in the manufacture of a solar cell having an integrated structure consisting of the substrate 10, the porous layer 20, and the metal electrode 30 in sequence.

The present invention further provides a method of filling a solid-state electrolyte having a high viscosity more efficiently and thus overcoming the limitation in the thickness of the photoelectrode.

The present invention further provides a manufacturing method of dye-sensitized solar cells with higher light-to-energy conversion efficiency.

Hereinafter, a description will be given as to a manufacturing method of dye-sensitized solar cells according to the embodiments with reference to FIGS. 1 and 2.

Firstly, according to one embodiment of the present invention, a step of forming a porous layer including metal oxide particles on a substrate 10 may be provided.

In this regard, the substrate 10 may be a transparent conducting substrate, which has an integrated structure of a transparent conducting oxide.

According to one example of the present invention, the substrate 10 may include a transparent substrate 1, and a conductive thin film 3 formed on the transparent substrate 1 and adjacent to the after-mentioned porous layer 20.

The transparent substrate 1 may be a conventional transparent substrate known in the related art without any specific limitation. According to the present invention, the transparent substrate 1 may be a plastic substrate including any one plastic material selected from the group consisting of polyethylene terephthalate, polyethylene naphthalate, polycarbonate, polypropylene, polyimide, triacetyl cellulose, polyether sulfone, methyltriethoxysilane, ethyltriethoxysilane, and propyltriethoxysilane. The transparent substrate 1 may also be a glass substrate, a quartz substrate, or a silicon substrate.

The conductive thin film 3 may have a thickness of 1 to 1000 nm, and preferably include metal nitrides, metal oxides, carbon compounds, or conductive polymers.

In this regard, the metal nitrides may be nitrides of Group IVB metals including titanium (Ti), zirconium (Zr), or hafnium (Hf); nitrides of Group VB metals including niobium (Nb), tantalum (Ta), or vanadium (V); nitrides of Group IVB metals including chromium (Cr), molybdenum (Mo), or tungsten (W); aluminum nitride; gallium nitride; indium nitride; silicon nitride; germanium nitride; or mixtures thereof.

The metal oxides may be at least one metal oxide selected from the group consisting of titanium (Ti) oxide, zirconium (Zr) oxide, strontium (Sr) oxide, zinc (Zn) oxide, indium (In) oxide, lanthanum (La) oxide, vanadium (V) oxide, molybdenum (Mo) oxide, tungsten (W) oxide, tin (Sn) oxide, niobium (Nb) oxide, magnesium (Mg) oxide, aluminum (Al) oxide, yttrium (Y) oxide, scandium (Sc) oxide, samarium (Sm) oxide, and gallium (Ga) oxide, or composite oxides thereof.

The carbon compounds may be activated carbon, graphite, carbon nanotubes, carbon black, graphene, or mixtures thereof.

The conductive polymer may be at least one polymer selected from the group consisting of [poly(3,4-ethylenedioxythiophene)]-[poly(styrenesulfonate)], camphorsulfonic acid-doped polyaniline, pentacene, polyacetylene, poly(3-hexylthiophene), polysiloxane carbazole, polyaniline, polyethylene oxide, poly(1-methoxy-4-(0-Disperse Red 1)-2,5-phenylene-vinylene, polyindole, polycarbazole, polypyridiazine, poly-isothianaphthalene, polyphenylene sulfide, polyvinyl pyridine, polythiophene, polyfluorene, polypyridine, polypyrrole, and polysulfur nitride.

The conductive thin film 3 may be formed to cover the transparent substrate 1 or formed in a defined pattern. The conductive thin film 3 in the form of a pattern may be formed by using a conventional etching device known in the related art. In association with the conductive thin film 3 in the form of a pattern, the solar cell including a solid-state electrolyte, unlike the solar cells including a liquid-state electrolyte, can be manufactured using a single transparent conducting substrate, so the conductive thin film 3 can be patterned in the form of a pattern through an etching process in order to separate a photoelectrode and a metal electrode from each other on a single substrate.

In another example, the substrate 10 may include a transparent substrate 1, a conductive thin film 3 formed on the transparent substrate 1, and a blocking layer 5 formed adjacent to an after-mentioned porous layer 20 and including metal oxides.

The block layer 5 is a layer for preventing recombination of electrons in the transparent conducting substrate by keeping the conductive thin film 3 out of a direct contact with the electrolyte. As the solid-state electrolyte in direct contact with the conductive thin film possibly may cause a problem in regards to the current loss due to its characteristics, such a problem can be minimized by introducing the blocking layer to prevent direct contact between the conductive thin film and the solid-state electrolyte. Though the description of an example of the present invention illustrates that the blocking layer 5 is included as a component of the substrate 10, such an illustrative example is not construed to limit the scope of the present invention. Instead, a transparent substrate 1 with a conductive thin film 3 formed thereon is first prepared, and a blocking layer 5 is then formed as a separate layer.

The blocking layer 5 may be formed by applying a paste including a precursor of metal oxides (for example, titanium diisopropoxide bis(acetylacetonate) represented by $Ti(acac)_2OiPr_2$ as a precursor of titanium oxide) on the transparent substrate 1 with the conductive thin film 3 formed thereon through a coating technique, and then carrying out heat treatment at about 400 to 500° C. However, the method of forming the blocking layer 5 is not limited to the aforementioned example, and may include a conventional thin film forming method known in the related art. In this regard, the thickness of the blocking layer 5 is preferably in the range of 100 to 250 nm with a view to securing the acquisition of the aforementioned effects.

Subsequently, a step of forming a porous layer 20 including metal oxide particles on the substrate 10 may be provided. The porous layer 20 is a structure forming a photoelectrode, where a photosensitized dye is adsorbed on the porous layer 20 through an after-mentioned process, and a solid-state electrode is filled in the pores of the porous layer 20.

According to one example of the present invention, the step of forming the porous layer 20 may be performed by applying a paste including metal oxide particles, a binder, and a solvent on the transparent conducting substrate 10 through screen printing, doctor blade coating, or the like and then carrying out heat treatment at a temperature of 450 to 550° C. for 1 to 2 hours. In this manner, the porous layer 20 containing metal oxide particles and having a plurality of pores (for example, pores with a diameter of 8 μm or less) on its surface or inside can be formed on the substrate 10.

Particularly, unlike the conventional methods, the manufacturing method of dye-sensitized solar cells according to the present invention makes it possible to fill the solid-state electrolyte with high efficiency, overcoming the limitation in the thickness of the photoelectrode. Accordingly, the present invention enables filling the solid-state electrolyte uniformly even when the porous layer 20 has a thickness of 4 μm or greater, preferably 1 to 10 μm, ultimately providing dye-sensitized solar cells with higher light-to-energy conversion efficiency.

On the other hand, the paste used to form the porous layer 20 is prepared by dispersing metal oxide particles in a solvent to make a colloidal solution having a viscosity of about $5 \times 10^4$ to $5 \times 10^5$ cps, adding a binder to the colloidal solution, and then removing the colloidal solution of the solvent by way of a distiller. In this regard, the preparation of the paste may be carried out according to the method known in the related art without any specific limitation in the mixing ratios and the types of the individual components of the paste.

The metal oxide particles may have a nano-scale particle size (preferably 10 to 100 nm), preferably including particles of at least one metal oxide selected from the group consisting of titanium (Ti) oxide, zirconium (Zr) oxide, strontium (Sr) oxide, zinc (Zn) oxide, indium (In) oxide, lanthanum (La) oxide, vanadium (V) oxide, molybdenum (Mo) oxide, tungsten (W) oxide, tin (Sn) oxide, niobium (Nb) oxide, magnesium (Mg) oxide, aluminum (Al) oxide, yttrium (Y) oxide, scandium (Sc) oxide, samarium (Sm) oxide, and gallium (Ga) oxide, or composite oxide particles thereof.

Examples of the binder used in the paste may include polyethylene glycol, polyethylene oxide, polyvinyl alcohol, polyvinyl pyrrolidone, ethyl cellulose, and so forth; and examples of the solvent may include ethanol, methanol, terpineol, lauric acid, and so forth.

According to one embodiment of the present invention, a step of adsorbing a photosensitized dye on the porous layer 20 may be performed.

In the present invention, the step of adsorbing the photosensitized dye may be performed by immersing the substrate 10 having the porous layer 20 in a solution containing a photosensitized dye for 10 minutes to 24 hours.

In this regard, the photosensitized dye is a compound having a band gap of 1 to 3.1 eV and thus is capable of adsorbing visible rays. The photosensitized dye as used herein may include any photosensitized dye known in the related art without any specific limitation. Examples of the photosensitized dye may include metal- or metal composite-containing photosensitized organic substances, photosensitized inorganic substances, photosensitized organic-inorganic composite substances, or mixtures thereof, where examples of the metal or metal composite may include aluminum (Al), platinum (Pt), palladium (Pd), europium (Eu), lead (Pb), iridium (Ir), ruthenium (Ru), selenium (Se), telluride (Te), sulfur (S), or composites thereof.

According to one embodiment of the present invention, a step of filling a solid-state electrolyte in the pores of the porous layer 20 with the photosensitized dye adsorbed thereon may be performed.

Particularly, in the present invention, the solid-state electrolyte can be filled through diffusion into the pores of the porous layer 20 by the pressure difference under vacuum conditions.

As already described above, the general manufacturing method of solid-state dye-sensitized solar cells involves immersing a photoelectrode including a dye-adsorbed porous layer in a solution of a solid-state electrolyte for a predetermined period of time under atmospheric pressure conditions to fill the solid-state electrolyte. However, such a conventional method has the problem that it is difficult for the solid-state electrolyte to uniformly penetrate into the porous layer due to its characteristics, with resultant deterioration in fill efficiency, such as taking a long time in filling the solid-state electrolyte.

Contrarily, the manufacturing method of the present invention involves filling the solid-state electrolyte through diffusion into the pores of the porous layer by the pressure difference under low-vacuum conditions, thereby enhancing the fill efficiency of the electrolyte, overcoming the limitation in the thickness of the photoelectrode, and ultimately securing the manufacture of dye-sensitized solar cells with higher light-to-energy conversion efficiency.

In the present invention, the step of filling the solid-state electrolyte may be performed by gradually increasing the pressure to atmospheric pressure under vacuum conditions of 50 to 70 kPa to diffuse the solid-state electrolyte into the pores of the porous layer 20. In other words, according to the present invention, the pores of the porous layer 20 with the photosensitized dye adsorbed thereon are set under vacuum and fed with a solid-state electrolyte while the pressure is gradually increased to atmospheric pressure, so the solid-state electrolyte can be more actively diffused into the pores of the porous layer 20 by the pressure difference and thus uniformly injected (filled) in the pores.

The method of diffusing the solid-state electrolyte into the pores by the pressure difference under vacuum conditions may be performed by increasing the pressure from low vacuum to atmospheric pressure to induce diffusion of the solid-state electrolyte. In an example without any specific limitation, the step of filling the solid-state electrolyte may be carried out under pressure increased from low vacuum of 50 to 70 kPa to about 95 to 110 kPa. In this regard, the increasing rate of the pressure is not specifically limited and may be controlled within a range that secures sufficient diffusion of the solid-state electrolyte.

Particularly, according to the present invention, the step of filling the solid-state electrolyte is preferably performed using a solid-state electrolyte filling device. A description will be separately given as to the solid-state electrolyte filling device apart from the manufacturing method of dye-sensitized solar cells.

After the solid-state electrolyte is filled in the pores of the porous layer 20 by the above-described method, under necessity, a step of forming an over-layer containing the solid-state electrolyte on the porous layer 20 may be performed. For example, the solid-state electrolyte is applied on the porous layer 20 already filled with the solid-state electrolyte by spin coating or a similar coating technique to form an over-layer.

In the step of filling the solid-state electrolyte, the solid-state electrolyte may be any conventional compound known in the related art without any specific limitation. According to the present invention, examples of the solid-state electrolyte may include any one compound selected from the group consisting of N,N'-diphenyl-N,N'-bis(3-methylphenyl)-1,1'-biphenyl-4,4'-diamine, poly[(2-methoxy-5-(3',7'-dimethyloctyloxy))-1,4-phenylenevinylene], poly(N-vinylcarbazole), N,N'-di(1-naphthyl)-N,N'-diphenylbenzidine, 4,4'-bis(carbazol-9-yl)-biphenyl, (deoxyribonucleic acid)-(hexadecyl trimethyl ammonium chloride), poly(3,4-ethylenedioxythiophene):poly(styrenesulphonic acid), and 2,2',7,7'-tetrakis(N,N-di-p-methoxyphenyl-amine)-9,9'-spirobifluorene. The solid-state electrolyte may be used while it is dispersed in an organic solvent, such as chlorobenzene, dichlorobenzene, chloroform, toluene, etc.

According to one embodiment of the present invention, a step of forming the metal electrode 30 on the porous layer 20 filled with the solid-state electrolyte may be performed.

The metal electrode 30 has a work function of about 5.0 and contains a metal with high electrical conductivity, preferably including silver (Ag), gold (Au), or a mixture thereof.

The step of forming the metal electrode 30 may be performed by a conventional electrode forming method known in the related art, preferably including sputtering, cathode arc deposition, vapor deposition, electron beam deposition, chemical vapor deposition, atomic layer deposition, electrochemical deposition, spin coating, spray coating, doctor blade coating, or screen printing.

Figure 2:
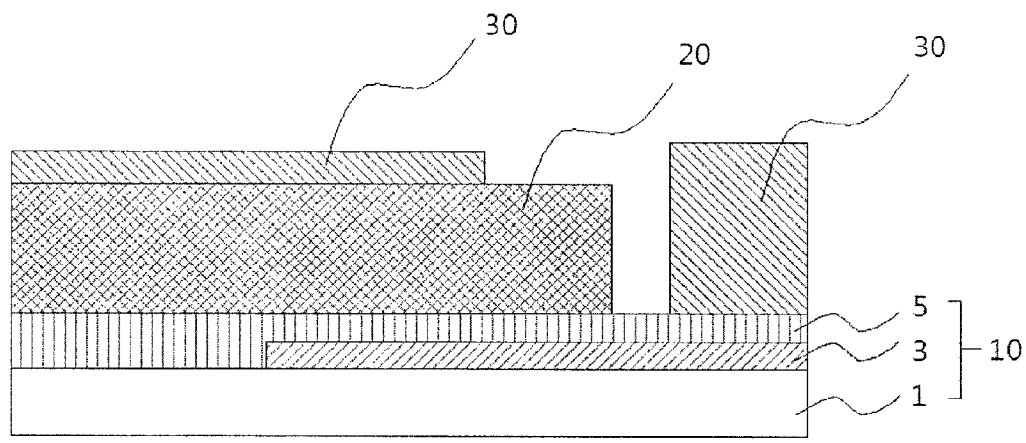
FIG. 2 is a schematic cross-sectional view showing the structure of a dye-sensitized solar cell manufactured according to one embodiment of the present invention.

In the present invention, the structure of the metal electrode 30 is not limited to the example shown in FIG. 2 and may, of course, include a conventional electrode structure known in the related art.

In accordance with another embodiment of the present invention, a solid-state electrolyte filling device for dye-sensitized solar cells is provided, which includes: a stage 100 for placing a substrate 10 including a porous layer 20 with a photosensitized dye adsorbed thereon; a chamber 200 covering the stage 100 to form a closed space; an electrolyte injecting portion 250 provided on the top of the chamber 200 and used to feed a solid-state electrolyte into the closed space through a nozzle; and a low-vacuum pump 300 connected to the chamber 200.

Figure 3:
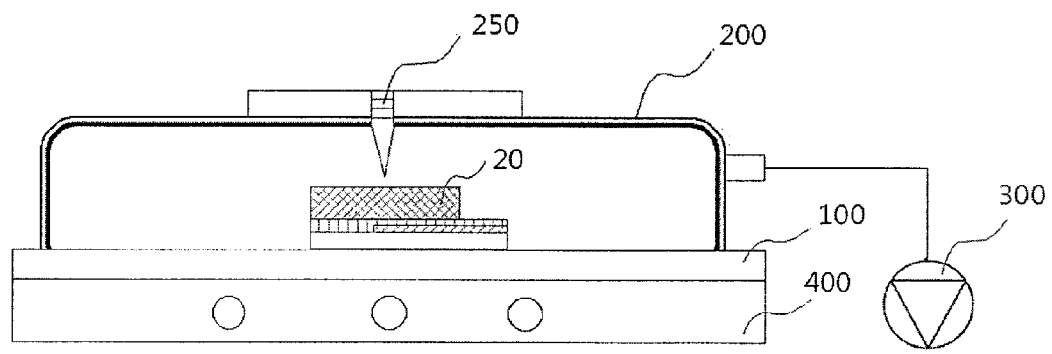
FIG. 3 is a schematic cross-sectional view showing the structure of a solid-state electrolyte filling device applicable to the manufacturing method according to one embodiment of the present invention.

The solid-state electrolyte filling device is a device for filling a solid-state electrolyte uniformly with higher density by way of the aforementioned principle (that is, the mechanism of filling a solid-state electrolyte by the pressure difference under vacuum conditions). FIG. 3 is a schematic illustration showing the cross-sectional structure of a device according to the embodiment of the present invention.

In the solid-state electrolyte filling device, the stage 100 is a plate on which a substrate 10 including a porous layer 20 with a photosensitized dye adsorbed thereon is to be placed. According to the present invention, the device may further include a fixing unit formed on the stage 100 to fix the substrate 10 on the stage 100. Preferably, the substrate 10 is fixed in the center of the stage 100 by way of the fixing unit.

In addition, the device may further include a heat transfer unit formed on the stage 100 to transfer heat to the substrate 10. The heat transfer unit is a means for increasing the temperature of the porous layer 20 by applying heat on the substrate 10, thereby temporarily lowering the viscosity of the electrolyte during injection of the solid-state electrolyte and further enhancing the fill efficiency of the electrolyte. Such a heat transfer unit can be provided to increase the temperature of the whole or part of the stage 100 to transfer a defined amount heat to the substrate 10. In this regard, the temperature of the stage 100 under the influence of the heat transfer unit can be set to a level so as to sufficiently acquire the aforementioned effects without adversely affecting the properties of the substrate or the porous layer, preferably in the range of 30 to 70° C.

In the solid-state electrolyte filling device according to the present invention, the chamber 200 covers the stage 100 to form a closed space in which the substrate 10 including the porous layer 20 with the photosensitized dye adsorbed thereon is to be placed.

In the solid-state electrolyte filling device, the electrolyte injecting portion 250 for supplying the solid-state electrolyte into the closed space through a nozzle may be provided on the top of the chamber 200 (that is, the outer circumference of the chamber 200). The device may further include a nozzle length adjusting unit provided in the electrolyte injecting portion 250 to adjust the distance between the nozzle and the stage 100. The nozzle length adjusting unit is used to control the length of the nozzle depending on the thickness of the substrate 10.

In the solid-state electrolyte filling device, the low-vacuum pump 300 is connected to the chamber 200 and used to control the pressure conditions of the closed space formed by the stage 100 and the chamber 200.

The solid-state electrolyte filling device may further include a control portion 400 to regulate the temperature of the stage 100 and the pressure of the closed space, thereby controlling the solid-state filling process under defined conditions.

The process of filling a solid-state electrolyte using the device may be performed as follows. Firstly, the substrate 10 including the porous layer 20 with the photosensitized dye adsorbed thereon is placed on the stage 100, which is then covered with the chamber 200. The low-vacuum pump 300 is switched on to maintain the pressure in the chamber 200 at 50 to 70 kPa. Subsequently, the pressure in the chamber 200 is gradually increased to atmospheric pressure to feed the solid-state electrolyte onto the porous layer 20 through the nozzle of the electrolyte injecting portion 250 and thereby to fill the solid-state electrolyte uniformly into the pores of the porous layer 20.

Hereinafter, the present invention will be described in further detail according to the embodiments as follows. However, these embodiments are provided as a mere illustration and are not intended to limit the scope of the invention.

Example 1

An electrically conductive glass substrate (manufactured by Philkington, FTO glass, 2.2 cm thick, 8 Ω/sq) was prepared as a substrate for solid-state dye-sensitized solar cells. 0.15 M of Ti(acac)$_2$OiPr$_2$ [titanium diisopropoxide bis(acetylacetonate)] was applied onto the substrate by spin coating, and the substrate was subjected to heat treatment at about 450° C. to form a blocking layer having a thickness of about 180 nm.

Apart from this, a paste of metal oxide particles was prepared by mixing 18.5 wt % of titanium oxide particles (number average particle diameter: about 20 nm), 0.05 wt % of a polymer as a binder (ethyl cellulose), and 81.45 wt % of a solvent (terpineol). The paste was applied onto the substrate by doctor blade coating, and the substrate was then subjected to heat treatment at about 500° C. for about 30 minutes to form a porous layer (about 4 μm in thickness) containing titanium oxide particles.

Then, an ethanol solution was prepared to contain 0.5 mM of a ruthenium composite, NaRu(4carboxylic acid-4'-carboxylate)(4,4'-dinonyl-2,2'-bipyridine)(NCS)$_2$, as a photosensitized dye. The substrate was immersed in the ethanol solution for 12 hours to adsorb the photosensitized dye on the surface of the porous layer.

Subsequently, the substrate was placed on the stage of the solid-state electrolyte injecting device having the construction of FIG. 3, which stage was then covered with the chamber. The low-vacuum pump was switched on to maintain the inner pressure of the chamber at about 60 kPa. The temperature of the stage was maintained at about 50° C. to preheat the substrate. The inner pressure of the stage was gradually increased to atmospheric pressure to inject about 0.25 μL of 2,2',7,7'-tetrakis(N,N-di-p-methoxyphenyl-amine)-9,9'-spirobifluorene as an electrolyte through the nozzle of the electrolyte injecting portion. Then, a spin coater (2500 rpm, 25 s) was used to apply the electrolyte on the porous layer and form an over-layer.

A silver (Ag) electrode having a thickness of about 250 nm was formed on the over-layer using thermal evaporation deposition equipment.

Example 2

An electrically conductive glass substrate (manufactured by Philkington, FTO glass, 2.2 cm thick, 8 Ω/sq) was prepared as a substrate for solid-state dye-sensitized solar cells. 0.15M of Ti(acac)$_2$OiPr$_2$ [titanium diisopropoxide bis(acetylacetonate)] was applied onto the substrate by spin coating, and the substrate was subjected to heat treatment at about 450° C. to form a blocking layer having a thickness of about 180 nm.

Apart from this, a paste of metal oxide particles was prepared by mixing 18.5 wt % of titanium oxide particles (number average particle diameter: about 20 nm), 0.05 wt % of a polymer as a binder (ethyl cellulose), and 81.45 wt % of a solvent (terpineol). The paste was applied onto the substrate by doctor blade coating, and the substrate was then subjected to heat treatment at about 500° C. for about 60 minutes to form a porous layer (about 8 μm in thickness) containing titanium oxide particles.

Then, an ethanol solution was prepared to contain 0.5 mM of a ruthenium composite, NaRu(4carboxylic acid-4'-carboxylate)(4,4'-dinonyl-2,2'-bipyridine)(NCS)$_2$, as a photosensitized dye. The substrate was immersed in the ethanol solution for 12 hours to adsorb the photosensitized dye on the surface of the porous layer.

Subsequently, the substrate was placed on the stage of the solid-state electrolyte injecting device having the construction of FIG. 3, which stage was then covered with the chamber. The low-vacuum pump was switched on to maintain the inner pressure of the chamber at about 60 kPa. The temperature of the stage was maintained at about 50° C. to preheat the substrate. The inner pressure of the stage was gradually increased to atmospheric pressure to inject about 0.5 μL of 2,2',7,7'-tetrakis(N,N-di-p-methoxyphenyl-amine)-9,9'-spirobifluorene as an electrolyte through the nozzle of the electrolyte injecting portion. Then, a spin coater (2500 rpm, 25 s) was used to apply the electrolyte on the porous layer and form an over-layer.

A silver (Ag) electrode having a thickness of about 250 nm was formed on the over-layer using thermal evaporation deposition equipment.

Comparative Example 1

An electrically conductive glass substrate (manufactured by Philkington, FTO glass, 2.2 cm thick, 8 Ω/sq) was prepared as a substrate for solid-state dye-sensitized solar cells. 0.15 M of Ti(acac)$_2$OiPr$_2$ [titanium diisopropoxide bis(acetylacetonate)] was applied onto the substrate by spin coating, and the substrate was subjected to heat treatment at about 450° C. to form a blocking layer having a thickness of about 180 nm.

Apart from this, a paste of metal oxide particles was prepared by mixing 18.5 wt % of titanium oxide particles (number average particle diameter: about 20 nm), 0.05 wt % of a polymer as a binder (ethyl cellulose), and 81.45 wt % of a solvent (terpineol). The paste was applied onto the substrate by doctor blade coating, and the substrate was then subjected to heat treatment at about 500° C. for about 30 minutes to form a porous layer (about 4 µm in thickness) containing titanium oxide particles.

Then, an ethanol solution was prepared to contain 0.5 mM of a ruthenium composite, NaRu(4carboxylic acid-4'-caboxylate)(4,4'-dinonyl-2,2'-bipyridine)(NCS)$_2$, as a photosensitized dye. The substrate was immersed in the ethanol solution for 12 hours to adsorb the photosensitized dye on the surface of the porous layer.

Subsequently, the substrate was placed on a hot stage having a temperature of about 50° C. About 2 µL of 2,2',7,7'-tetrakis(N,N-di-p-methoxyphenyl-amine)-9,9'-spirobifluorene as an electrolyte was applied dropwise on the substrate under atmospheric pressure, and the substrate was let stand for about 2 minutes to allow penetration of the electrolyte into the porous layer. Then, a spin coater (2500 rpm, 25 s) was used to apply the electrolyte on the porous layer and form an over-layer.

A silver (Ag) electrode having a thickness of about 250 nm was formed on the over-layer using thermal evaporation deposition equipment.

Comparative Example 2

An electrically conductive glass substrate (manufactured by Philkington, FTO glass, 2.2 cm thick, 8 Ω/sq) was prepared as a substrate for solid-state dye-sensitized solar cells. 0.15 M of Ti(acac)$_2$OiPr$_2$ [titanium diisopropoxide bis(acetylacetonate)] was applied onto the substrate by spin coating, and the substrate was subjected to heat treatment at about 450° C. to form a blocking layer having a thickness of about 180 nm.

Apart from this, a paste of metal oxide particles was prepared by mixing 18.5 wt % of titanium oxide particles (number average particle diameter: about 20 nm), 0.05 wt % of a polymer as a binder (ethyl cellulose), and 81.45 wt % of a solvent (terpineol). The paste was applied on the substrate by doctor blade coating, and the substrate was then subjected to heat treatment at about 500° C. for about 60 minutes to form a porous layer (about 8 µm in thickness) containing titanium oxide particles.

Then, an ethanol solution was prepared to contain 0.5 mM of a ruthenium composite, NaRu(4carboxylic acid-4'-caboxylate)(4,4'-dinonyl-2,2'-bipyridine)(NCS)$_2$, as a photosensitized dye. The substrate was immersed in the ethanol solution for 12 hours to adsorb the photosensitized dye on the surface of the porous layer.

Subsequently, the substrate was placed on a hot stage having a temperature of about 50° C. About 5 µL of 2,2',7,7'-tetrakis(N,N-di-p-methoxyphenyl-amine)-9,9'-spirobifluorene as an electrolyte was applied dropwise on the substrate under atmospheric pressure, and the substrate was let stand for about 2 minutes to allow penetration of the electrolyte into the porous layer. Then, a spin coater (2500 rpm, 25 s) was used to apply the electrolyte on the porous layer and form an over-layer.

A silver (Ag) electrode having a thickness of about 250 nm was formed on the over-layer using thermal evaporation deposition equipment.

Experimental Example 1

Evaluation of Cell Performance

The dye-sensitized solar cells according to Example 1 and Comparative Example 1 were measured in regards to open-circuit voltage, photocurrent density, energy conversion efficiency, and fill factor. The measurement results are presented in Table 1.

Figure 5:
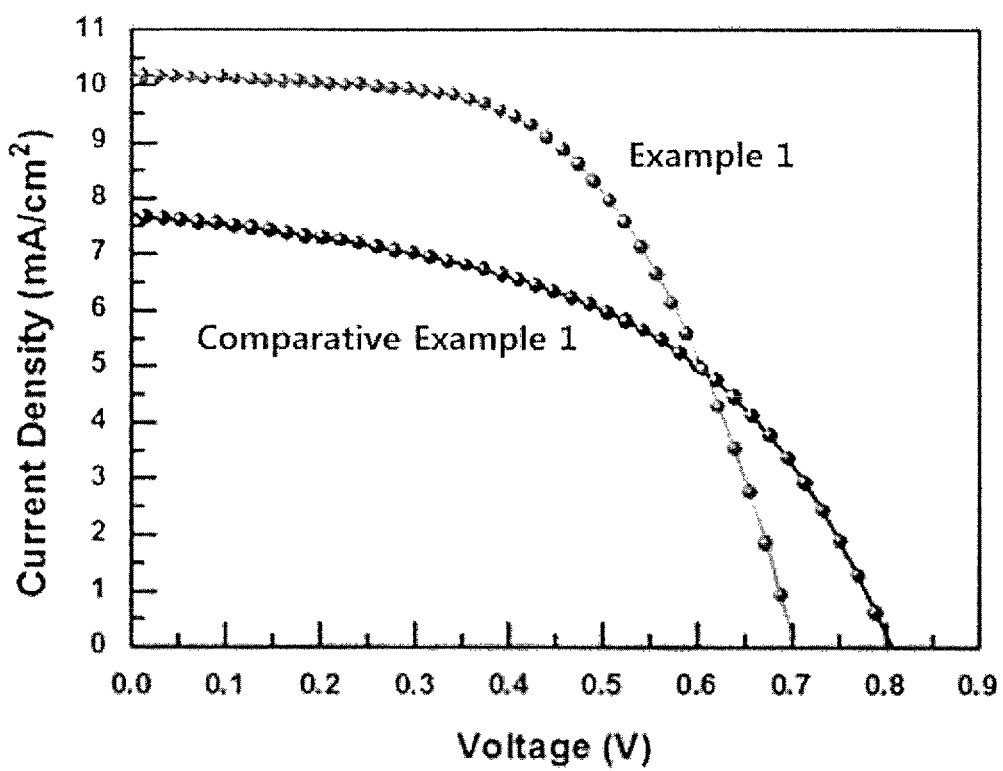
FIG. 5 is a graph showing current-voltage curves for dye-sensitized solar cells according to the example of the present invention and the comparative example.

In addition, the dye-sensitized solar cells according to Example 1 and Comparative Example 1 were measured in regards to the current-voltage change under AM 1.5G 1 Sun conditions. The measurement results are shown in FIG. 5.

1) Open-circuit voltage (Voc) and photocurrent density (Jsc): The open-circuit voltage and the photocurrent density were measured with Keithley SMU2400 equipment.

2) Energy conversion efficiency (ECE) and fill factor (FF): The energy conversion efficiency was measured with a solar simulator of 1.5 AM 100 mW/cm$^2$ (consisting of a Xe lamp [1600 W, YAMASHITA DENSO], an AM 1.5 filter, and Keithley SMU2400 equipment), and the fill factor was determined using the measured energy conversion efficiency according to the following calculation formula.

Fill Factor (%)=[$(J·V)_{max}/(J_{sc}·V_{oc})$]×100   [Calculation Formula]

In the calculation formula, J is the value of the Y-axis in the conversion efficiency curve; V is the value of the X-axis in the conversion efficiency curve; and $J_{sc}$ and $V_{oc}$ are the intercepts of the respective axes.

TABLE 1

| | $J_{sc}$ (mA/cm$^2$) | $V_{oc}$ (V) | FF (%) | ECE (%) | Area (cm$^2$) |
|---|---|---|---|---|---|
| Example 1 | 10.202 | 0.703 | 0.571 | 4.097 | 0.250 |
| Comparative Example 1 | 7.700 | 0.807 | 0.496 | 3.080 | 0.266 |

As can be seen from Table 1 and FIG. 5, the solar cell according to Example 1 that fills the solid-state electrolyte by the method of the present invention can acquire a higher fill factor, higher energy conversion efficiency, and more enhanced cell performance, compared to the solar cell according to Comparative Example 1 that fills the solid-state electrolyte by the conventional method.

Experimental Example 2

Evaluation of Fill Efficiency of Solid-State Electrolyte

The cross-sections of the dye-sensitized solar cells according to Example 1 and Comparative Example 1 were observed with a SEM (scanning electron microscope). The observation results are presented in FIG. 4a (Example 2) and FIG. 4b (Comparative Example 2).

Figure 4A:
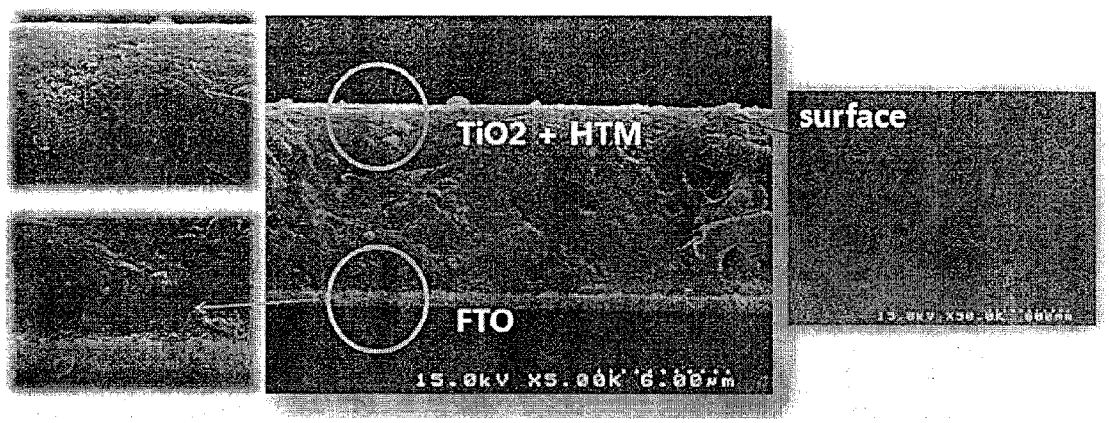
FIG. 4a is a picture showing an enlarged cross-section of the dye-sensitized solar cell manufactured by the method according to one embodiment of the present invention.
Figure 4B:
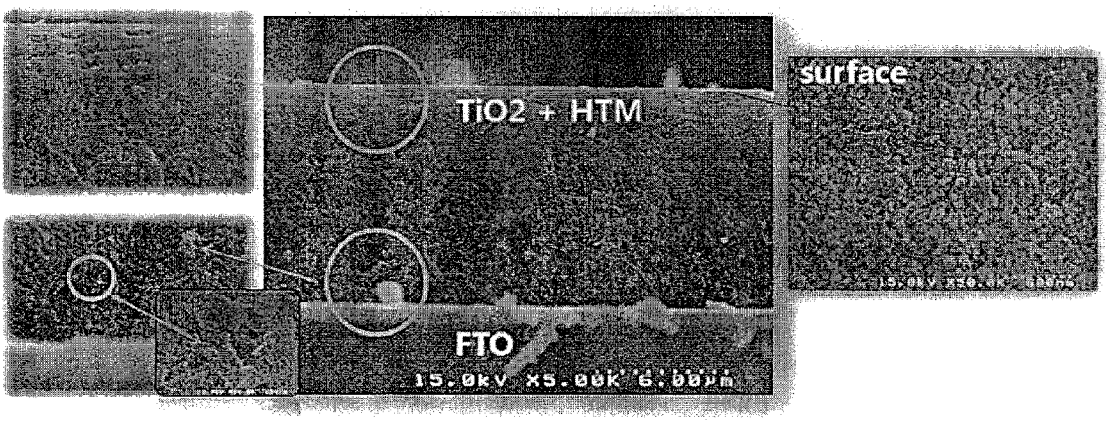
FIG. 4b is a SEM picture showing the cross-section of a dye-sensitized solar cell manufactured according to the conventional method.

As shown in FIG. 4b, the solar cell of Comparative Example 2 showed that the porous layer filled with the solid-state electrolyte had a rough cross-section, which appeared rougher towards the transparent conducting substrate. This explicitly reveals that the convention method of filling the solid-state electrolyte as used in Comparative Example 2 led to a deterioration of the fill factor and remained a limitation in forming the porous layer to a thickness having a predetermined thickness or above.

Contrarily, as shown in FIG. 4a, the solar cell of Example 2 showed that the porous layer had a smooth cross-section, which appeared smooth in almost the whole area irrespective of the distance from the transparent conducting substrate. In other words, the solar cell of Example 2 had the solid-state electrolyte filled in the pores of the porous layer with high density in spite of the polymer layer having a large thickness of 8 μm.

What is claimed is:

1. A manufacturing method of dye-sensitized solar cells, comprising:
    (a) forming a porous layer comprising metal oxide particles on a substrate;
    (b) adsorbing a photosensitized dye on the porous layer;
    (c) filling a solid-state electrolyte in pores of the porous layer with the photosensitized dye adsorbed thereon under vacuum conditions by increasing pressure to atmospheric pressure from under vacuum conditions of 50 to 70 kPa; and
    (d) forming a metal electrode on the porous layer filled with the solid-state electrolyte.

2. The manufacturing method as claimed in claim 1, wherein the step (c) of filling the solid-state electrolyte is performed by gradually increasing pressure to atmospheric pressure under vacuum conditions of 50 to 70 kPa results in filling the pores of the porous layer with the solid-state electrolyte through diffusion.

3. The manufacturing method as claimed in claim 1, wherein the substrate comprises; a transparent substrate; a conductive thin film formed on the transparent substrate; and a blocking layer covering the conductive thin film, being adjacent to the porous layer, and containing a metal oxide.

4. The manufacturing method as claimed in claim 3, wherein the transparent substrate is a plastic substrate, a glass substrate, a quartz substrate, or a silicon substrate, the plastic substrate comprising any one selected from the group consisting of polyethylene terephthalate, polyethylene naphthalate, polycarbonate, polypropylene, polyimide, triacetyl cellulose, polyether sulfone, methyltriethoxysilane, ethyltriethoxysilane, and propyltriethoxysilane.

5. The manufacturing method as claimed in claim 3, wherein the conductive thin film comprises a metal nitride, a metal oxide, a carbon compound, or a conductive polymer.

6. The manufacturing method as claimed in claim 3, wherein the blocking layer comprises a titanium oxide.

7. The manufacturing method as claimed in claim 3, wherein the blocking layer has a thickness of 100 to 250 nm.

8. The manufacturing method as claimed in claim 1, wherein the step (a) of forming the porous layer is performed by applying a paste comprising metal oxide particles, a binder, and a solvent onto the substrate and then performing heat treatment at a temperature of 450 to 550° C. for 1 to 2 hours.

9. The manufacturing method as claimed in claim 1, wherein the metal oxide particles contained in the porous layer are particles of at least one metal oxide selected from the group consisting of titanium (Ti) oxide, zirconium (Zr) oxide, strontium (Sr) oxide, zinc (Zn) oxide, indium (In) oxide, lanthanum (La) oxide, vanadium (V) oxide, molybdenum (Mo) oxide, tungsten (W) oxide, tin (Sn) oxide, niobium (Nb) oxide, magnesium (Mg) oxide, aluminum (Al) oxide, yttrium (Y) oxide, scandium (Sc) oxide, samarium (Sm) oxide, and gallium (Ga) oxide, or composite oxide particles thereof.

10. The manufacturing method as claimed in claim 1, wherein the porous layer 20 has a thickness of 1 to 10 μm.

11. The manufacturing method as claimed in claim 1, wherein the step (b) of adsorbing the photosensitized dye is performed by immersing the substrate 10 having the porous layer 20 formed thereon in a solution containing a photosensitized dye for 10 minutes to 24 hours.

12. The manufacturing method as claimed in claim 1, wherein the photosensitized dye includes a compound having a band gap of 1 to 3.1 eV.

13. The manufacturing method as claimed in claim 1, wherein the solid-state electrolyte includes at least one compound selected from the group consisting of N,N'-diphenyl-N,N'-bis(3-methylphenyl)-1,1'-biphenyl-4,4'-diamine, poly[(2-methoxy-5-(3',7'-dimethyloctyloxy))-1,4-phenylenevinylene], poly(N-vinylcarbazole), N,N'-di(1-naphthyl)-N,N'-diphenylbenzidine, 4,4'-bis(carbazol-9-yl)-biphenyl, (deoxyribonucleic acid)-(hexadecyl trimethyl ammonium chloride), poly(3,4-ethylenedioxythiophene):poly(styrenesulphonic acid), and 2,2',7,7'-tetrakis(N,N-di-p-methoxyphenyl-amine)-9,9'-spirobifluorene.

14. The manufacturing method as claimed in claim 1, wherein the step (d) of forming the metal electrode is performed by sputtering, cathode arc deposition, vapor deposition, electron beam deposition, chemical vapor deposition, atomic layer deposition, electrochemical deposition, spin coating, spray coating, doctor blade coating, or screen printing.

15. The manufacturing method as claimed in claim 1, wherein the metal electrode has a thickness of 50 to 300 nm.

16. The manufacturing method as claimed in claim 1, wherein the metal electrode comprises silver (Ag), gold (Au), or a mixture thereof.

* * * * *